United States Patent [19]

Watanabe et al.

[11] Patent Number: 5,112,437
[45] Date of Patent: May 12, 1992

[54] OXIDE FILM REMOVING APPARATUS AND REMOVING METHOD THEREOF USING AZEOTROPIC VAPOR MIXTURE

[75] Inventors: Nobuatsu Watanabe, 136 Uguisudail, Nagaokakyo-shi, Kyoto; Yong-Bo Chong, Kyoto; Toshio Tatsuno; Tomoyoshi Okada, both of Osaka; Akira Izumi; Keiji Toei, both of Kyoto, all of Japan

[73] Assignees: Dainippon Screen Mfg. Co., Ltd.; Nobuatsu Watanabe, both of Kyoto; Morita Kagaku Co., Ltd., Osaka, all of Japan

[21] Appl. No.: 658,054

[22] Filed: Feb. 20, 1991

[30] Foreign Application Priority Data

Feb. 20, 1990 [JP] Japan ................................ 2-40388

[51] Int. Cl.⁵ ..................... B44C 1/22; C03C 15/00; C03C 25/06
[52] U.S. Cl. ...................................... 156/646; 134/3; 134/31; 156/657; 156/345; 252/79.1; 252/79.3; 252/79.4
[58] Field of Search ............. 156/646, 653, 657, 662, 156/345; 134/2, 3, 31, 39; 252/79.1, 79.3, 79.4

[56] References Cited

U.S. PATENT DOCUMENTS

| | | |
|---|---|---|
| 4,749,440 | 6/1988 | Blackwood et al. ............... 156/646 |
| 4,900,395 | 2/1990 | Syverson et al. ............... 156/646 X |
| 4,904,338 | 2/1990 | Kozicki ........................... 156/646 X |
| 5,022,961 | 6/1991 | Izumi et al. ....................... 156/646 |

Primary Examiner—William A. Powell
Attorney, Agent, or Firm—Ostrolenk, Faber, Gerb & Soffen

[57] ABSTRACT

In oxide film removing equipment for removing a $SiO_2$ film on a semiconductor substrate by using hydrogen fluoride, a liquid mixture of hydrogen fluoride and methyl alcohol is prepared in a chemical factory beforehand. The liquid mixture of hydrogen fluoride and methyl alcohol is heated to generate azeotropic vapor at a semiconductor works and the vapor is used to remove the $SiO_2$ film on the substrate. The liquid mixture of hydrogen fluoride and methyl alcohol previously prepared in the chemical factory increases safety during an operation at the semiconductor works.

14 Claims, 5 Drawing Sheets

FIG.6

| EMBODIMENT | CONDITIONS OF EXPERIMENT | | | | ETCHING RATE (Å/min) |
|---|---|---|---|---|---|
| | N₂ GAS FLOW RATE (ℓ/min) | | | TEMPERATURE (°C) | |
| | VIA PIPE 38 | VIA PIPE 58 | VIA PIPE 76 | | |
| 1 | 1.0 | 6.0 | — | 25 | 800 |
| | 0.5 | 6.0 | — | 25 | 420 |
| 2 | 1.0 | 6.0 | 1.0 | 25 | 1180 |
| | 0.5 | 6.5 | 1.0 | 25 | 600 |

OXIDE FILM REMOVING APPARATUS AND REMOVING METHOD THEREOF USING AZEOTROPIC VAPOR MIXTURE

BACKGROUND OF THE INVENTION

1. Field of the Invention

This invention relates to an oxide film removing apparatus and to a method for removing an oxide film or the like formed on a surface of a silicon wafer, a surface of a polysilicon film and a surface of an amorphous silicon film (these surfaces are referred to as "silicon layer surfaces" hereinafter) during manufacturing of a semiconductor device, and particularly, it relates to an apparatus and a method for removing the oxide film or the like by using hydrogen fluoride gas.

2. Description of the Related Art

A natural oxide film ($SiO_2$) formed on, for example, a surface of a silicon wafer in a manufacturing process of the semiconductor device adversely affects the operation characteristics of the device. $SiO_2$ should be, therefore, removed from the surface of the wafer before formation of a film by CVD, sputtering or the like.

A method of removing the silicon oxide film from a surface of a silicon wafer is disclosed in Japanese Patent Publication No. 62-502930 (referred to as "the first prior art method") corresponding to PCT/US86/01714 based on U.S. application Ser. No. 770,27. According to the method, an anhydrous hydrogen fluoride gas, vapor and a dry nitrogen gas are fed from separate sources with their flow rates controlled to obtain a predetermined mixture ratio. The mixture is fed to a reactive chamber in which gas substrate is stored. The exposure of the substrate surface to these gases removes the silicon oxide film.

Another method is disclosed in, for example, *SUBMICRON ULSI PROCESS TECHNIQUE*, Proceedings of The Seventh Super LSI Ultracleaning Technology Symposium 1988-7, published by Realize Inc., pp 173-194, (hereinafter referred to as "the second prior art method"). A super high concentration anhydrous hydrogen fluoride gas containing an extremely small amount of water is fed to a reactive chamber with a high density nitrogen gas of super low water content as a carrier gas. $SiO_2$ on a silicon wafer and hydrogen fluoride are reacted with each other in the reactive chamber. As a result, the silicon oxide film is removed.

According to the first prior art method, the gases of the respective components having their flow rates separately controlled are mixed with each other. The composition of vapor mixture to be supplied to the substrate is individually controlled. As a result, the concentration of hydrogen fluoride in the anhydrous hydrogen fluoride gas source is as high as 99.99%. Extremely high concentration liquid anhydrous hydrogen fluoride is used also in the second prior art method.

The foregoing will be described with reference to the drawings. As shown in FIG. 1, a high concentration hydrogen fluoride gas produced in a chemical factory equipped with safety facilities is conventionally brought to a semiconductor manufacturing facility. This hydrogen fluoride gas is used for removing an oxide film as the semiconductor manufacturing facility.

As described above, a semiconductor manufacturing facility conventionally necessitates a very high concentration anhydrous hydrogen fluoride gas which is extremely poisonous and harmful to humans. The anhydrous hydrogen fluoride gas must not therefore be allowed to leak into air. Maintenance and control of the gas system and a changing of gas cylinders always requires the greatest possible care. Consequently, a facility for removing the oxide film must be equipped with the same safety features as those in a chemical factory treating harmful chemical materials which is highly disadvantageous.

Furthermore, vapor is added to the anhydrous hydrogen fluoride gas in the first prior art method. The application of this method to etching of a silicon oxide film on a silicon wafer, for example, causes such an undesirable side reaction as follows:

$$SiO_2 + 2H_2O = S_i(OH)_4 \qquad (1)$$

or such a reverse reaction to the etching occurs to cause colloidal metasilicate ($H_2SiO_3$) or silicon dioxide ($SiO_2$) to be attached on the wafer surface, which results in contamination.

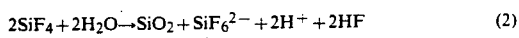

$$2SiF_4 + 2H_2O \rightarrow SiO_2 + SiF_6^{2-} + 2H^+ + 2HF \qquad (2)$$

In the second prior art method, the water content of the supply gas should be maintained at an extremely low value in order to reproduce the process. This consumes much time in controlling the water content in the gas supply system.

According to the first prior art method, the three constituent gases have their flow rates controlled separately to control the composition of the vapor mixture, which makes the arrangement of the entire control system very complicated. The arrangement of the gas supply system itself is also complicated because the vapor mixture is obtained by mixing the gases of the three components after the flow rates thereof are controlled.

SUMMARY OF THE INVENTION

Therefore, an object of the present invention is to increase the safety of a facility equipped with an oxide film removing apparatus in an oxide film removing system for removing an oxide film from a substrate by using hydrogen fluoride.

Another object of the present invention is to prevent mixture of water in an oxide film removing apparatus for removing an oxide film from a substrate by using hydrogen fluoride.

A still further object of the present invention is to increase the safety factor in an oxide film removing apparatus for removing an oxide film from a substrate by using hydrogen fluoride.

A still further object of the present invention is to simplify the control system of an oxide film removing apparatus for removing an oxide film from a substrate by using hydrogen fluoride.

A still further object of the present invention is to prevent intrusion of water in a process of an oxide film removing method for removing an oxide film from a substrate by using hydrogen fluoride.

A still further object of the present invention is to increase the safety of a facility wherein removal of an oxide film is carried out by an oxide film removing method for removing an oxide film from a substrate by using hydrogen fluoride.

The above-described objects of the present invention can be achieved by an oxide film removing system including the following elements involved in removing the oxide film from a substrate by using hydrogen fluoride. Specifically, the oxide film removing method according to the present invention includes the steps of preparing a liquid mixture of hydrogen fluoride and alcohol in a chemical factory wherein they are separately produced beforehand, generating azeotropic vapor of the prepared liquid mixture and removing the oxide film of a substrate by using the generated azeotropic vapor. The steps of generating azeotropic vapor and removing the oxide film using the azeotropic vapor are carried out at a facility equipped with an oxide film removing apparatus.

In the oxide film removing method according to the present invention, a liquid mixture of hydrogen fluoride and alcohol is manufactured beforehand in a chemical factory equipped with safety systems and the liquid mixture is sent to the facility provided with an oxide film removing apparatus such as a semiconductor manufacturing facility. It is not necessary that a hydrogen fluoride gas of a harmfully high concentration be used in the semiconductor facility. As a result, the safety of the oxide film removing apparatus is increased.

According to another aspect of the present invention, the oxide film removing apparatus for removing an oxide film from a substrate by using hydrogen fluoride includes an azeotropic vapor generating device for generating an azeotropic vapor mixture of hydrogen fluoride and alcohol by conditioning a liquid mixture of hydrogen fluoride and alcohol for azeotrophy and an oxide film removing device for removing an oxide film from a substrate by using the generated vapor.

In the oxide film removing apparatus according to the present invention, a liquid mixture of hydrogen fluoride and alcohol is conditioned for azeotrophy and a vapor thereof is used to remove an oxide film from a substrate. That is, the oxide film is removed from the substrate by using only the vapor mixture of hydrogen fluoride and alcohol. As a result, no water is used in the oxide film removing apparatus.

"Azeotrophy" refers, as is known in art, to the phenomenon by which the ratio of a composition of a vapor mixture coincides with the ratio of composition of a liquid mixture when the same evaporates (boils) providing that the composition ratio, temperature and pressure satisfy a given relation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram showing the experimental results obtained by using the oxide film removing apparatus according to the present invention.

DESCRIPTION OF THE PREFERRED EMBODIMENTS

(1) System Description

Figure 1:
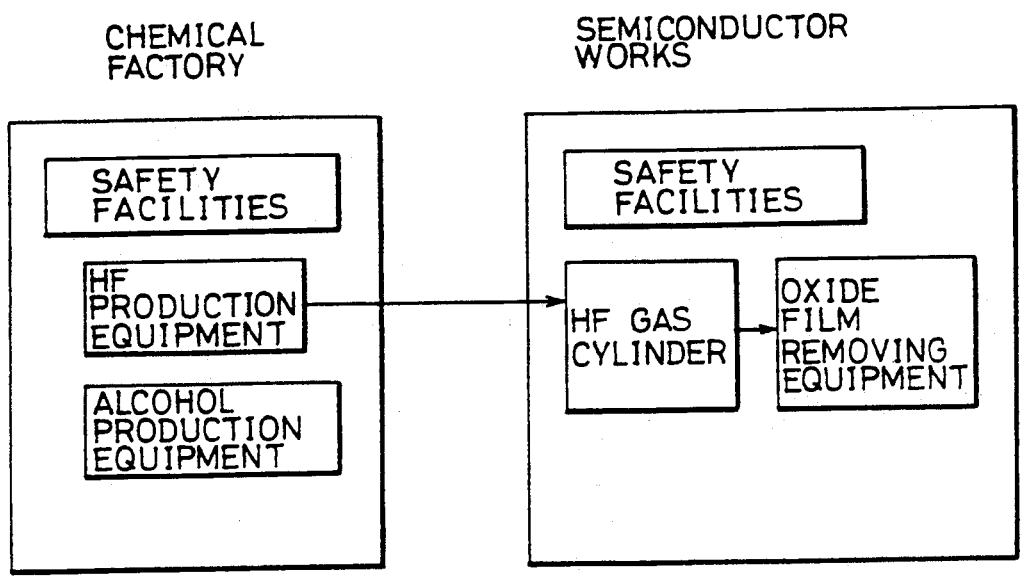
FIG. 1 is a diagram showing a relation between conventional chemical factory and semiconductor facility.
Figure 2:
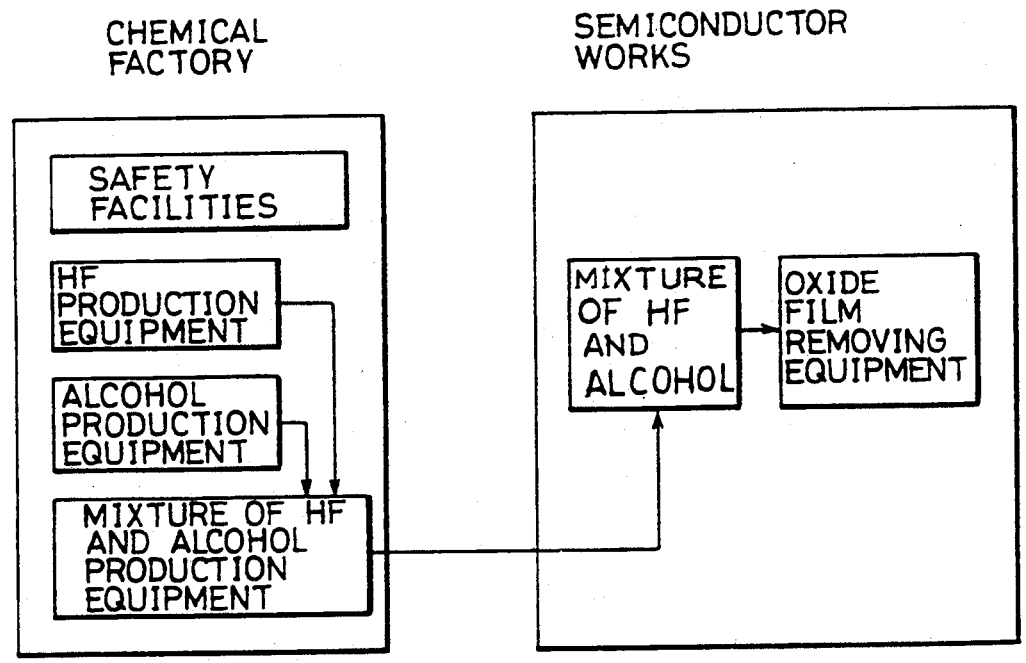
FIG. 2 is a diagram showing a relation between a chemical factory and a semiconductor facility adopting an oxide film removing system according to the present invention.

A system for removing an oxide film from a semiconductor substrate according to the present invention will be first described with reference to FIG. 2. In this system, a mixture of hydrogen fluoride and alcohol required for removing an oxide film is produced beforehand in a chemical factory fully equipped with safety systems. The mixture of hydrogen fluoride and alcohol is sent to a semiconductor producing facility provided with an oxide film removing apparatus by which an oxide film is removed. The semiconductor facility does not need to treat a hydrogen fluoride gas of high density, which makes it unnecessary to have as conventionally required safety systems. As a result, an oxide film can be easily removed from a semiconductor substrate at the semiconductor manufacturing site.

In addition, since the liquid mixture of hydrogen fluoride and alcohol has such a composition as to obtain an azeotropic mixture, its boiling point attains a maximum value and the vapor pressure of the liquid mixture is considerably lower than high concentration anhydrous hydrogen fluoride. The liquid mixture therefore hardly evaporates even if it leaks into air and the hydrogen fluoride is diluted with alcohol to have a relatively low concentration, which enhances safety.

(2) Description of Oxide Film Removing Equipment

(i) Outline of the Equipment

Oxide film removing equipment for removing an oxide film on a silicon substrate according to the present invention will be first summarized The oxide film removing equipment according to the present invention accepts a liquid mixture of hydrogen fluoride and alcohol previously mixed to have a predetermined ratio. The liquid mixture is heated to become azeotropic the resultant azeotropic vapor being used to remove the oxide film from a substrate. The removal of the oxide film by using vapor in an azeotropic condition which is generated from the liquid mixture of hydrogen fluoride and alcohol causes no adverse effect of water on a silicon substrate.

The liquid mixture of hydrogen fluoride and alcohol is evaporated under azeotropic conditions, so that the composition of the respective components of the evaporated vapor mixture is the same as the composition of the liquid mixture in the azeotropic condition. A vapor mixture of a fixed composition can be obtained at any time, which allows continuous supplying of the vapor mixture of hydrogen fluoride and alcohol of a fixed composition to a substrate solely by maintaining the azeotropic conditions. The liquid mixture of hydrogen fluoride and alcohol in the azeotropic condition evaporates to generate vapor having the same composition as that of the liquid mixture. Since a composition of the liquid mixture does not vary with evaporation, it is not necessary to control the concentration of the liquid mixture, but replenishing of the liquid mixture of the predetermined composition is required.

In addition, alcohol such as methanol and ethanol and water infinitely dissolve with each other. Even if some water exists in atmosphere, the water dissolves into alcohol and is removed from the reaction system and, therefore, the troublesome need control the water content of a gas supply system, as disclosed in the second prior art method, is avoided.

(ii) Contents of Specific Equipment (A) First Embodiment

Figure 3:
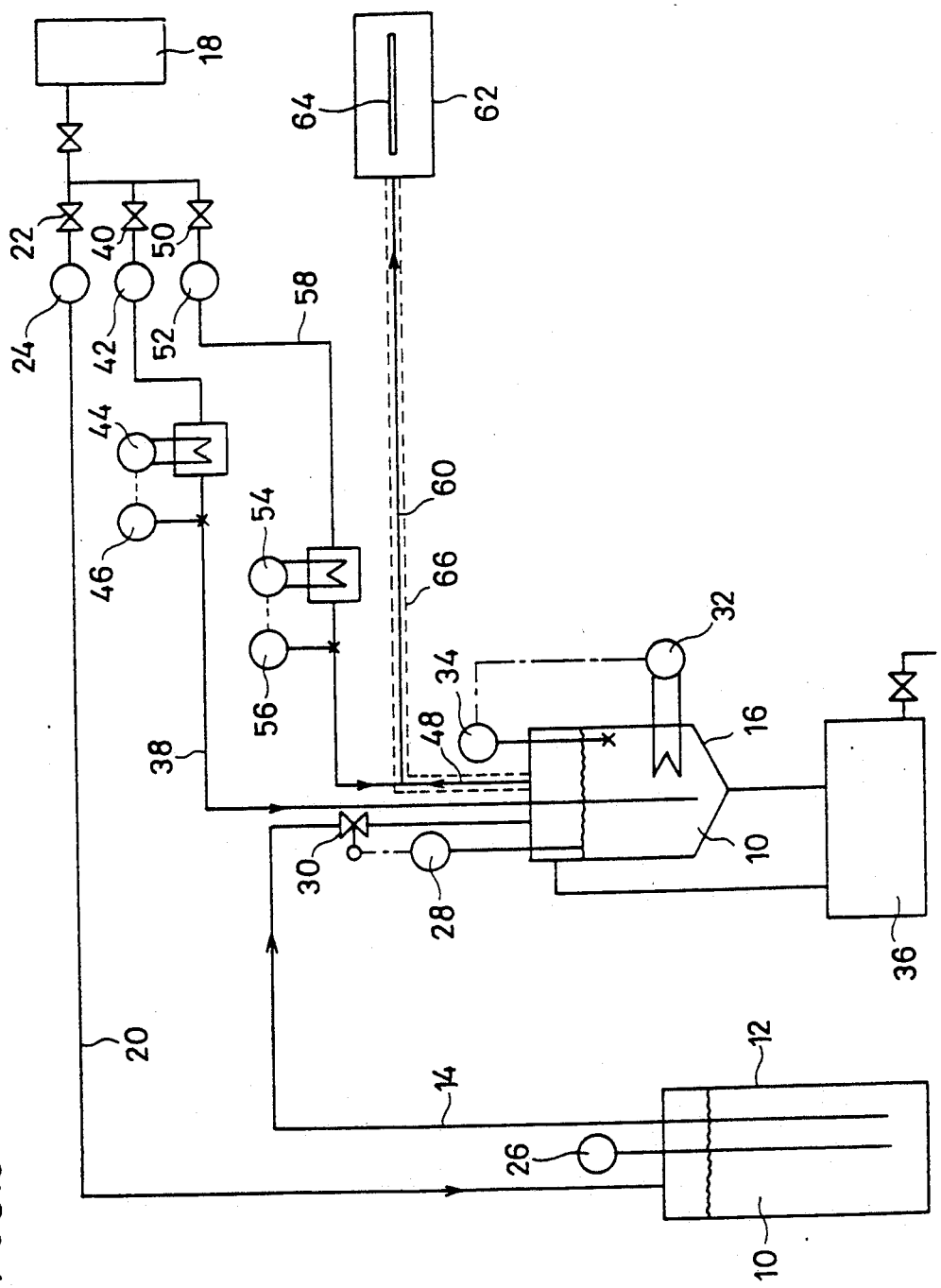
FIG. 3 is a diagram showing a first embodiment of the semiconductor removing apparatus according to the present invention.

FIG. 3 is the diagram showing the schematic arrangement of the substrate surface treating equipment according to the first embodiment. As shown in the drawing, a liquid mixture 10 of an azeotropic composition of anhydrous hydrogen fluoride and alcohol previously prepared in a chemical factory is stored in a gas tight storage tank 12. Storage tank 12 has an inner side surface coated with a material that is corrosion resistant to hydrogen fluoride, for example, with fluoride resin.

Figure 4:
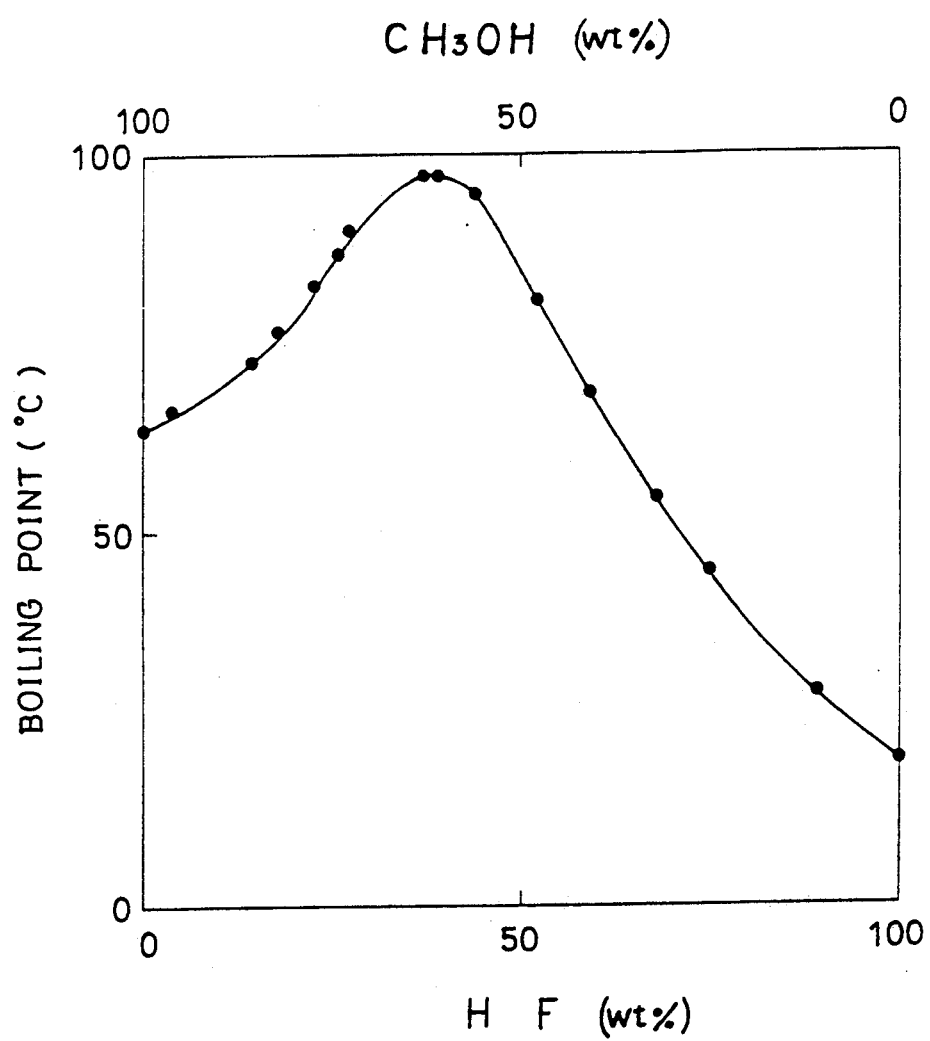
FIG. 4 is a diagram showing a relation between a boiling point and a composition of methanol-hydrogen fluoride at atmospheric pressure.

As shown in FIG. 4, which illustrates a boiling point and a composition of a methanol-hydrogen fluoride at atmospheric pressure, anhydrous hydrogen fluoride and alcohol, for example, methanol, has a maximum boiling point at a composition of 38.5 weight % of hydrogen fluoride and 61.5 weight % of methanol. This is the azeotropic point at which the boiling point is 97° C. A liquid mixture of 38.5 weight % of hydrogen fluoride and 61.5 weight % of methanol is prepared and the liquid mixture 10 is stored in storage tank 12. Liquid mixture 10 in storage tank 12 need not to be heated.

Storage tank 12 is connected to a vaporizer 16 by means of a liquid conveying pipe 14. Nitrogen gas is fed from a nitrogen gas supply source 18 to storage tank 12 through a supply pipe 20 provided with a control valve 22 and a flowmeter 24. Application of pressure on the liquid surface of liquid mixture 10 in storage tank 12 by using the nitrogen gas causes storage tank 12 to supply liquid mixture 10 into vaporizer 16 through liquid conveying pipe 14. A liquid level meter 26 is provided at storage tank 12. All the pipes in contact with liquid or gas hydrogen fluoride are made of such a material of hydrogen fluoride resistance as fluoride resin. An O-ring for gas tightness is made of perfluoroelastomer, for example.

The inner wall surface of vaporizer 16 is also made of fluoride resin or the like of hydrogen fluoride resistance and is gas tight. A liquid level controller 28 is provided at vaporizer 16. The adjustment of opening of a switching valve 30 provided at liquid conveying pipe 14 based on a signal from liquid level controller 28 causes storage tank 12 to supply liquid mixture 10 to vaporizer 16 as described above to maintain the level of the liquid surface of liquid mixture 10 in vaporizer 16 constant. A heater 32 and a temperature controller 34 are provided at vaporizer 16. Temperature controller 34 controls heater 32 to maintain the temperature of liquid mixture 10 in vaporizer 16 at the azeotropic temperature of 97° C. The total pressure of vaporizer 16 is 760 mmHg (atmospheric pressure). A drain tank 36 is installed below vaporizer 16.

Vaporizer 16 is connected to nitrogen gas supply source 18 by means of a supply pipe 38 with a supply opening disposed near the bottom portion of vaporizer 16. The nitrogen gas with its flow rate controlled to a predetermined value by a control valve 40 and a flowmeter 42 from nitrogen gas supply source 18 is controlled to have an azeotropic temperature of 97° C. by a heater 44 and a temperature controller 46 and the temperature-controlled nitrogen gas is fed to vaporizer 16. The evaporated vapor mixture of hydrogen fluoride and methanol in vaporizer 16, together with the nitrogen gas supplied to vaporizer 16, is fed from vaporizer 16 through a supply pipe 48 and then supplied through a supply pipe 60 to a silicon wafer 64 stored in a chamber 62 gas-tightly separated from the air.

When the concentration of the vapor mixture should be kept low, the nitrogen gas supplied from nitrogen gas supply source 18 through a supply pipe 58 is mixed with the vapor mixture fed from vaporizer 16 through supply pipe 48. The nitrogen gas to be mixed with is regulated to have a predetermined flow rate by a control valve 50 and a flowmeter 52 and to have a predetermined temperature by a heater 54 and a temperature controller 56. The vapor mixture containing the nitrogen gas is supplied to silicon wafer 64 in chamber 62 through pipe 60. Supply pipes 48 and 60 are insulated by a heat insulating material 66 as indicated by broken lines in order to prevent formation of dew in the pipes.

As shown in the foregoing, keeping the concentration of the vapor mixture low decreases the etching rate of an oxide film. When an interlayer insulating film ($SiO_2$) is formed on a substrate, for example, the low concentration vapor mixture can be used in the following process. In the case where an interconnection contact hole and a natural oxide film in a contact region are simultaneously removed by etching, low concentration vapor allows a reduced etching rate of $SiO_2$ which becomes an interlayer insulating film to remove the natural oxide film in the contact region through etching.

When the vapor mixture of hydrogen fluoride and methanol is supplied to silicon wafer 64 stored in chamber 62 by using the apparatus having the arrangement shown in FIG. 3, liquid mixture 10 of hydrogen fluoride and methanol evaporates in evaporator 16 under azeotropic conditions. The composition ratio (in terms of ratio by weight) of hydrogen fluoride and methanol of the evaporated vapor mixture is as before 38.5:61.5, the liquid mixture 10. Therefore, even if the amount of liquid mixture 10 is reduced as it evaporates in evaporator 16, the ratio of composition of hydrogen fluoride and methanol of the evaporated vapor mixture in evaporator 16 remains 38.5:61.5, that is, it is kept constant at all times. This enables continuous supplying of the vapor mixture of hydrogen fluoride and methanol of a fixed composition on ratio to the silicon wafer 64. The reduced liquid mixture 10 resulting from the evaporation in evaporator 16 is replenished with liquid mixture 10 of hydrogen fluoride and methanol of the above-described ratio of composition from storage tank 12 to evaporator 16 as needed by controlling switching valve 30 in response to a signal from liquid level controller 28.

As before, the liquid mixture 10 of hydrogen fluoride and methanol in the azeotropic composition ratio is replenished to evaporator 16 from storage tank 12 as needed while the temperature of liquid mixture 10 in evaporator 16 is maintained at the azeotropic temperature of 97° C. in this oxide film removing equipment. Simply controlling the flow rate of the nitrogen gas to be supplied from nitrogen gas supply source 18 to evaporator 16 through supply pipe 38 and furthermore, the flow rate of the nitrogen gas to be fed to supply pipe 48 from nitrogen gas supply source 18 through supply pipe 58 according to circumstances, vapor mixture of hydrogen fluoride and methanol with the concentration adequately fixed, together with a carrier gas, can be supplied to silicon wafer 64 stored in chamber 62.

The results obtained from the actual experiment carried out using a rinsing apparatus of the arrangement shown in FIG. 3 will be described. In the experiment, a thermal oxide film of 3,500 Å thick formed on a surface of a phosphorous doped n type silicon wafer having a resistivity of 2-8 Ω·cm by wet oxidation was removed by rinsing at a temperature of 25° C. As a result, when the oxide film on the surface of silicon wafer 64 was rinsed (a process of removing an oxide film through etching) with the flow rate of the nitrogen gas supplied from nitrogen gas supply source 18 to evaporator 16 through supply pipe 38 set to 1 l/min and the flow rate of the nitrogen gas supplied and mixed with the vapor mixture generated in evaporator 16 through supply pipe 58 set to 6 l/min, the etching rate of the silicon thermal oxide film was 800 Å/min. When the flow rate of the nitrogen gas supplied to evaporator 16 was set to 0.5 l/min and the flow rate of the nitrogen gas mixed with the vapor mixture was set to 6.5 l/min, the etching rate of the silicon thermal oxide film was 420 Å/min.

(B) The Second Embodiment

Figure 5:
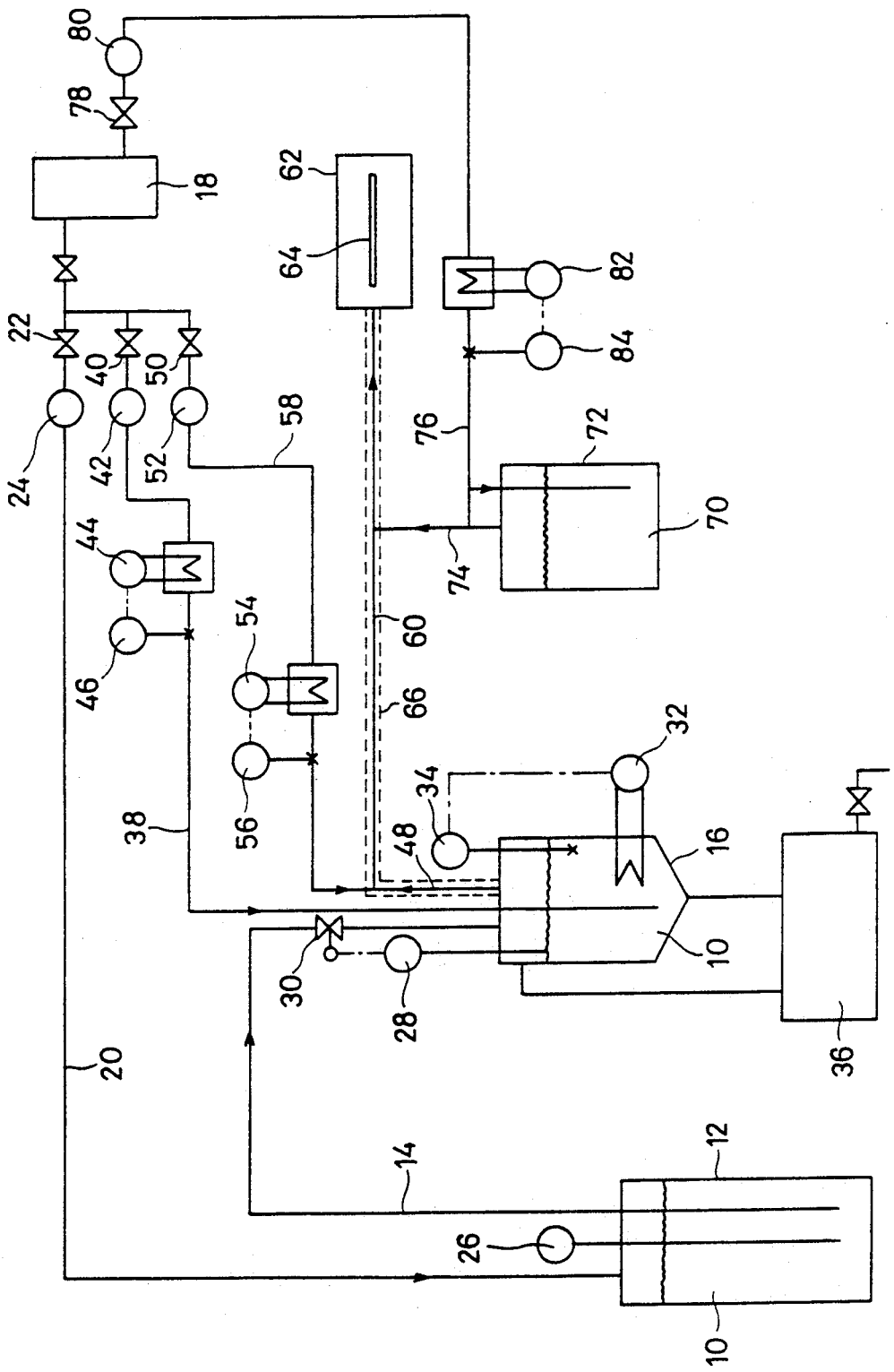
FIG. 5 is a diagram showing a second embodiment of an oxide film removing apparatus according to the present invention.

The second embodiment of the present invention will be described with reference to FIG. 5. In FIG. 5, elements with numerals appearing in FIG. 3 are the same as and have the functions described in the first embodiment. The apparatus shown in FIG. 5 differs from that of FIG. 3 in that a solvent vapor generating container 72 for storing solvent, for example, methanol 70 is provided and a solvent vapor supplying pipe 74 in communication with the solvent vapor generating container 72 is connected at the midway point of supply pipe 60.

In this apparatus methanol vapor of a fixed concentration is generated by feeding nitrogen gas of a fixed flow rate as a carrier gas into solvent vapor generating container 72 through a supply pipe 76. The methanol vapor is fed through solvent vapor supplying pipe 74 to be mixed with a gas containing vapor mixture of hydrogen fluoride and methanol in a fixed composition ratio fed from evaporator 16. The mixed vapor is supplied to silicon wafer 64 stored in chamber 62.

The apparatus shown in FIG. 5 allows stable supplying of the vapor mixture in a desired composition ratio to silicon wafer 64 by controlling the composition ratio of the vapor mixture of hydrogen fluoride of a reduced concentration and solvent vapor of an increased concentration.

Test data obtained with the second embodiment was as follows.

The oxide film on the surface of silicon wafer 64 was rinsed by supplying an mixing the nitrogen gas supplied from nitrogen gas supply source 18 to evaporator 16 through supply pipe 38 with the flow rate thereof set to 1 l/min, the nitrogen gas supplied and mixed with the vapor mixture generated in evaporator 16 through supply pipe 58 with the flow rate thereof set to 6 l/min and the nitrogen gas supplied to the solvent vapor generating container (methanol vapor generating container) 72 with the flow rate thereof set to b 1 l/min to and with the vapor mixture generated in evaporator 16 through a supply pipe 74. In this case, the temperature of the space of solvent vapor generating container 72 was maintained at 25° C. and the nitrogen gas supplied was at an ordinary temperature (room temperature). In this case, the etching rate of the silicon thermal oxide film was 1180 Å/min.

When the flow rate of the nitrogen gas supplied to evaporator 16, the flow rate of the nitrogen gas mixed with the vapor mixture and the flow rat of the nitrogen gas supplied to the methanol vapor generating container were set to 0.5 l/min, 6.5 l/min and 1 l/min, respectively, the etching rate of the silicon thermal oxide film was 600 Å/min.

FIG. 6 shows the test data in the first and the second embodiments.

As shown in FIG. 6, the etching rate of the second embodiment is higher than that of the first embodiment. The reason is that menthol vapor is additionally supplied in the second embodiment and the degree of dissociation of HF is increased as the concentration of methanol in the system becomes higher. In other words, the concentration of the active species $HF_2$ in the etching reaction is increased (at the same HF concentration). The second embodiment, therefore, has the higher etching rate.

While the method of supplying a gas for treating a substrate surface according to the present invention has been described above, the scope of the present invention is not limited by the above-described description and the contents of the drawings. That is, the type of alcohol in use is not limited to methanol but may be ethanol, isopropyl alcohol or the like which can be made into an azeotropic mixture together with hydrogen fluoride under practical conditions such as temperature and the like. In the second embodiment the solvent vapor to be mixed with the vapor mixture of hydrogen fluoride and alcohol may be a solvent of a different kind from that of the alcohol contained in the vapor mixture.

The present invention can be applied not only to a process for removing a silicon natural oxide film on the surface of a silicon wafer but also to a process for removing a silicon natural oxide film formed on the surface of a polysilicon film or an amorphous silicon film. Such polysilicon film and amorphous silicon film may be formed not only on a silicon wafer but also on, for example, various semiconductor wafers such as gallium arsenide wafer and the like, or on various substrates such as a glass substrate and a ceramic substrate. The present invention is not limited to the removal of a silicon natural oxide film but it may be applied to etching of a silicon thermal oxide film, a silicon oxide film formed by other method than thermal oxidation (for example CVD etc.) or such silicon insulating films as a nitrogen silicon film, a phosphosilicate glass (PSG) film, a boro-phosphosilicate glass (BPSG) film and an arsenosilicate glass (AsSG) film.

As noted above, a "substrate surface" in the arrangement of the present invention includes not only a silicon wafer surface but also surfaces of silicon layers on such various semiconductor wafers as gallium arsenide wafer and the like and surfaces of a polysilicon film and an amorphous silicon film on a glass substrate.

Although the present invention has been described and illustrated in detail, it is clearly understood that the same is by way of illustration and example only and is not to be taken by way of limitation, the spirit and scope of the present invention being limited only by the terms of the appended claims

What is claimed is:

1. An oxide film removing method system for removing an oxide film from a substrate by using hydrogen fluoride, comprising the steps of:
   preparing a mixture of hydrogen fluoride and alcohol in a chemical factory wherein said hydrogen fluoride and alcohol are separately manufactured beforehand,
   generating azeotropic vapor of said prepared mixture, and removing said oxide film of the substrate by using said generated azeotropic vapor, said steps of generating said azeotropic vapor and removing the oxide film of the substrate by using said azeotropic vapor being performed at a facility where the removal of said oxide film is carried out.

2. The oxide film removing method according to claim 1, further comprising diluting said azeotropic vapor with alcohol.

3. An oxide film removing apparatus for removing an oxide film from a substrate by using hydrogen fluoride, comprising:

azeotropic vapor generating means for generating azeotropic vapor of hydrogen fluoride and alcohol by conditioning a liquid mixture of said hydrogen fluoride and alcohol to establish azeotropic conditions, and oxide film removing means for removing said oxide film from said substrate by using said azeotropic vapor.

4. The oxide film removing apparatus according to claim 3, further comprising liquid mixture supplying means for supplying said liquid mixture of hydrogen fluoride and alcohol to said azeotropic vapor generating means.

5. The oxide film removing apparatus according to claim 4, further comprising alcohol vapor mixing means for mixing alcohol vapor with said azeotropic vapor.

6. The oxide film removing apparatus according to claim 4, wherein said azeotropic vapor is carried by an inert gas.

7. The oxide film removing apparatus according to claim 6, wherein said liquid mixture is carried by an inert gas.

8. The oxide film removing apparatus according to claim 4, wherein said azeotropic vapor generating means includes heating means.

9. An oxide film removing method for removing an oxide film from a substrate by using hydrogen fluoride, comprising the steps of:

conditioning a liquid mixture of hydrogen fluoride and alcohol to establish azeotropic conditions, in a manner whereby said liquid mixture is effective for generating azeotropic vapor when placed under azeotropic conditions, and removing an oxide layer film from a substrate by using said azeotropic vapor.

10. The oxide film removing method according to claim 9, further comprising preparing a mixture of said hydrogen fluoride and alcohol prior to said conditioning step.

11. The oxide film removing method according to claim 10, further comprising mixing alcohol vapor with said azeotropic vapor.

12. A method of removing an oxide film from a substrate by using hydrogen fluoride, comprising the steps of:

providing separate supplies of hydrogen fluoride and alcohol and preparing, at a chemical factory, a mixture of hydrogen fluoride and alcohol;

transporting said mixture of hydrogen fluoride and alcohol to a semiconductor manufacturing facility;

generating an azeotropic vapor of said mixture of hydrogen fluoride and alcohol at said semiconductor manufacturing facility; and removing said oxide film of the substrate by exposing said substrate to said azeotropic vapor.

13. The method of claim 12, wherein said generating step comprising controlling the temperature of said mixture.

14. The method of claim 13, wherein the alcohol is selected from the group of methanol, ethanol and isopropyl alcohol.

* * * * *